(12) United States Patent
Park et al.

(10) Patent No.: US 9,055,663 B2
(45) Date of Patent: Jun. 9, 2015

(54) TOUCH PANEL AND METHOD FOR MANUFACTURING THE SAME

(71) Applicant: SAMSUNG ELECTRO-MECHANICS CO., LTD., Suwon (KR)

(72) Inventors: Jang Ho Park, Suwon (KR); Jung Ryoul Yim, Suwon (KR); Jae Chan Park, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 117 days.

(21) Appl. No.: 13/845,044

(22) Filed: Mar. 17, 2013

(65) Prior Publication Data

US 2014/0184934 A1 Jul. 3, 2014

(30) Foreign Application Priority Data

Dec. 28, 2012 (KR) .......................... 10-2012-0157261

(51) Int. Cl.
 G02F 1/1335 (2006.01)
 H05K 3/00 (2006.01)
 G06F 3/044 (2006.01)
(52) U.S. Cl.
 CPC ........ *H05K 3/00* (2013.01); *G06F 3/044* (2013.01); *G06F 2203/04103* (2013.01)
(58) Field of Classification Search
 None
 See application file for complete search history.

(56) References Cited

FOREIGN PATENT DOCUMENTS

KR 10-2009-0003261 A 1/2009

*Primary Examiner* — Richard Kim
(74) *Attorney, Agent, or Firm* — Ladas & Parry, LLP

(57) ABSTRACT

Disclosed herein is a touch panel, including: a window substrate divided into an active area and a non-active area surrounding the active area; an electrode part having an electrode bezel pattern formed of a bezel ink in the active area of the window substrate and an electrode pattern integrally formed on one surface of the electrode bezel pattern; and a bezel part formed of the bezel ink in the non-active area of the window substrate, to surround the electrode part.

5 Claims, 3 Drawing Sheets

TOUCH PANEL AND METHOD FOR MANUFACTURING THE SAME

CROSS REFERENCE TO RELATED APPLICATION

This application claims the benefit of Korean Patent Application No. 10-2012-0157261, filed on Dec. 28, 2012, entitled "Touch Panel and Manufacturing the Same", which is hereby incorporated by reference in its entirety into this application.

BACKGROUND OF THE INVENTION

1. Technical Field

The present invention relates to a touch panel and a method for manufacturing the same.

2. Description of the Related Art With the development of computers using a digital technology, devices assisting computers have also been developed, and personal computers, portable transmitters and other personal information processors execute text and graphic processing using a variety of input devices such as a keyboard and a mouse.

While the rapid advancement of an information-oriented society has been widening the use of computers more and more, products may not be effectively operated by using only the keyboard and mouse that are currently responsible for the input device function. Therefore, the need for a device that is simple, has minimum malfunction, and is capable of easily inputting information has increased.

In addition, current techniques for input devices have progressed toward techniques related to high reliability, durability, innovation, designing and processing beyond the level of satisfying general functions. To attain these objects, a touch panel has been developed as an input device capable of inputting information such as text, graphics, or the like.

The touch panel is mounted on the display surface of an image display device such as an electronic organizer, a flat panel display including a liquid crystal display (LCD), a plasma display panel (PDP), an electroluminescence (El) element or the like, or a cathode ray tube (CRT), so that a user selects the desired information while viewing the image display device.

The touch panel is classified into a resistive type touch panel, a capacitive type touch panel, an electromagnetic type touch panel, a surface acoustic wave (SAW) type touch panel, and an infrared type touch panel. These various types of touch panels are adapted for electronic products in consideration of signal amplification problems, resolution difference, level of difficulty of designing and processing technologies, optical characteristics, electrical characteristics, mechanical characteristics, environment-resistant characteristics, input characteristics, durability, and economic efficiency. Currently, a capacitive type touch panel and a digital resistive type touch panel have been used in a wide range of fields.

As one example of the touch panel, as described in the patent document, studies on the reduction in visibility for an electrode pattern have been continuously conducted.

However, in the touch panel of the prior art, as an electrode pattern, which is to be formed of a transparent conductor, is formed of an opaque metal material, it is necessary to improve visibility of the metal electrode pattern.

For achieving this, efforts to improve visibility of a metal electrode pattern are being made by, for example, performing blackening treatment on the electrode pattern or changing the design structure of an electrode pattern formed in a mesh pattern.

However, in the case where this metal material is used for the mesh pattern, there are process difficulties that a separate material for giving black color needs to be added or the blackening treatment needs to be further performed after forming the electrode pattern in order to miniaturize the line width of the metal electrode pattern and also perform blackening treatment on the mesh pattern.

In addition, even though the mesh pattern is blackened by the blackening treatment, visibility of the mesh pattern may not be improved.

PRIOR ART DOCUMENT

Patent Document (Patent Document 1) Korean Patent Laid-Open Publication No. 10-2009-0003261 (Jan. 9, 2009)

SUMMARY OF THE INVENTION

The present invention has been made in an effort to provide a touch panel having improved visibility to an electrode pattern.

The present invention has been also made in an effort to provide a method for manufacturing a touch panel having improved visibility to an electrode pattern.

According to one preferred embodiment of the present invention, there is provided a touch panel, including: a window substrate divided into an active area and a non-active area surrounding the active area; an electrode part having an electrode bezel pattern formed of a bezel ink in the active area of the window substrate and an electrode pattern integrally formed on one surface of the electrode bezel pattern; and a bezel part formed of the bezel ink in the non-active area of the window substrate, to surround the electrode part.

The touch panel may further include: an insulating layer burying the electrode part and the bezel part; and an anti-reflection layer joined to the window substrate by using the insulating layer as an intermediate.

The touch panel may further include: a transparent substrate having a second electrode pattern corresponding to the electrode part; an insulating layer provided between the window substrate and the transparent substrate; and an anti-reflection layer provided on the other surface of the transparent substrate.

The electrode part may be formed in a mesh pattern.

The bezel ink may have black color, white color, gold color, red color, green color, yellow color, gray color, purple color, brown color, blue color, or a combination thereof.

According to another preferred embodiment of the present invention, there is provided a method for manufacturing a touch panel, the method including: (A) sequentially stacking a bezel ink layer and a metal layer on one surface of a window substrate; (B) performing a patterning process including exposing and etching on the metal layer to form an electrode pattern and a bus line connected to the electrode pattern; and (C) performing a patterning process on the bezel ink layer to form an electrode part and a bezel part surrounding the electrode part, the electrode part including an electrode bezel pattern integrally formed with the electrode pattern.

The step (A) may include: (A-1) coating a bezel ink on an upper surface of the window substrate to form the bezel ink layer, the bezel ink having black color, white color, gold color, red color, green color, yellow color, gray color, purple color, brown color, blue color, or a combination thereof; and (A-2) forming the metal layer on the upper surface of the bezel ink layer by plating or PVD.

Here, in the step (C), the patterning process may be performed on the bezel ink layer by using the electrode pattern and the bus line.

Here, in the step (C), the electrode part may be formed in a mesh pattern.

According to still another preferred embodiment of the present invention, there is provided a method for manufacturing a touch panel, the method including: (I) forming an electrode bezel pattern and a bezel part on one surface of a window substrate by using a bezel ink; (II) forming a photoresist pattern exposing regions in which an electrode pattern and a bus line are to be formed; and (III) filling the photoresist pattern with a metal material and then releasing the photoresist pattern to form an electrode part and the bezel part surrounding the electrode part, the electrode part including the electrode pattern integrally formed with the electrode bezel pattern.

The step (I) may include: (I-1) coating the bezel ink on one surface of the window substrate to form the bezel ink layer, the bezel ink having black color, white color, gold color, red color, green color, yellow color, gray color, purple color, brown color, blue color, or a combination thereof; and (I-2) performing a patterning process including exposing and etching on the bezel ink layer to form the electrode bezel pattern and the bezel part.

The step (III) may include: (III-1) filling the photoresist pattern with the metal material by plating or PVD; and (III-2) releasing the photoresist pattern by a lift-off process.

Here, in the step (III), the bus line may be formed on the bezel part and connected to the electrode pattern.

Here, in the step (III), the electrode part may be formed in a mesh pattern.

BRIEF DESCRIPTION OF THE DRAWINGS

The above and other objects, features, and advantages of the present invention will be more clearly understood from the following detailed description taken in conjunction with the accompanying drawings, in which.

DESCRIPTION OF THE PREFERRED EMBODIMENTS

Figure 1:
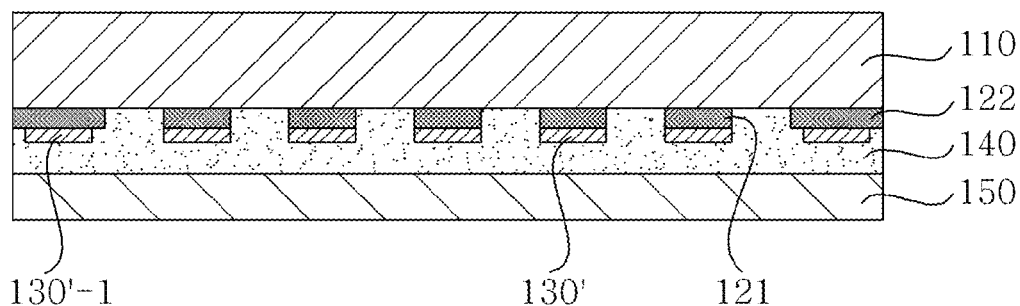
FIG. 1 is a cross-sectional view of a touch panel according to one preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the accompanying drawings. FIG. 1 is a cross-sectional view of a touch panel according to a preferred embodiment of the present invention. A single-layer structure mutual capacitive type touch panel is described as an example of a touch panel 100 according to one preferred embodiment of the present invention shown in FIG. 1. Here, in the single-layer structure mutual capacitive type touch panel shown in FIG. 1, two kinds of electrode patterns 130' including a driving electrode and a sensing electrode are positioned on the same plane. As for the single-layer structure mutual capacitive type touch panel, a bridge structure (not shown) may be provided at a cross point of the two kinds of electrode patterns in order to prevent electric connection therebetween.

A touch panel 100 according to one preferred embodiment of the present invention may include: a window substrate 110 divided into an active area and a non-active area surrounding the active area; an electrode part having an electrode bezel pattern 121 formed of a bezel ink on a lower surface of the active area of the window substrate 110 and an electrode pattern 130' integrally formed on one surface of the electrode bezel pattern 121; a bezel part 122 surrounding the electrode part in the non-active area of the window substrate 110; and an insulating layer 140 burying the electrode part between the window substrate 110 and an anti-reflection layer 150.

The window substrate 110 is provided at an outermost region of the touch panel 100, protects inner constitutions of the touch panel 100 including the electrode part and the bezel part 122, and allows an upper surface thereof to receive a touch by an input unit. Here, a material for the window substrate 110 is not particularly limited, but the window substrate 110 may be formed of glass or tempered glass.

In addition, the window substrate 110 may have a protecting layer provided on the upper surface thereof. That is, at least one of the protecting layers, such as a hard coating layer, an anti-finger layer, an anti-glare layer, and the like may be provided on the upper surface of the window substrate 110.

The electrode part may include the electrode bezel pattern 121 of a bezel ink formed on the lower surface of the active area of the window substrate 110 and the electrode pattern 130' formed on the lower surface of the electrode bezel pattern 121. The electrode bezel pattern 121 and the electrode pattern 130' may be formed in for example a linear shape, a polygonal shape, or a mesh shape.

The bezel part 122 may have a bus line 130'-1 provided on a lower surface thereof and connected with the electrode pattern 130'.

Particularly, since the electrode part may be formed in a mesh pattern, the electrode bezel pattern 121 and the electrode pattern 130' may be integrally provided in a mesh pattern.

Here, the electrode bezel pattern 121 may be formed of the same bezel ink as the bezel part 122 and thus may have the same color as the bezel part 122 in a mesh pattern.

Specifically, the color of the electrode bezel pattern 121 and the bezel part 122 may be black color, white color, gold color, red color, green color, yellow color, gray color, purple color, brown color, blue color, or a combination thereof.

A material for the bezel ink capable of realizing the color of the electrode bezel pattern 121 and the bezel part 122 will be specifically described as follows.

(1) The electrode bezel pattern 121 and the bezel part 122 may be formed in black color, by using a carbon based material (graphene oxide, diamond line carbon (DLC)), chrome based oxide (CrO, $CrO_2$), copper based oxide (CuO), manganese based oxide ($MnO_2$), cobalt based oxide (CoO), sulfide ($CoS_2$, $Co_3S_4$), nickel based oxide ($Ni_2O_3$), HgTe, $YBa_2Cu_3O_7$, $MoS_2$, $RuO_2$, PdO, InP, SnO, TaN, $TaS_2$, or the like.

(2) The electrode bezel pattern 121 and the bezel part 122 may be formed in white color, by using titanium based oxide ($TiO_2$), aluminum based oxide ($Al_2O_3$), magnesium based oxide (MgO), sodium based oxide ($Na_2O$), lithium based oxide ($Li_2O$), beryllium based oxide (BeO), magnesium based sulfide (MgS, $MgF_2$, $MgCo_3$, ZnO, ZnS, $KNO_3$, KCl, KOH, $Ga_2O_3$, RbCl, RbF, $BaTiO_3$, $BaSO_4$, $BaCl_2$, BaO, $Ba(NO_3)_2$, $BaCO_3$, BaOH, $BaB_2O_4$, $SrTiO_3$, $SrCl_2$, SrO, $Y_2O_3$, $YCl_3$, $YF_3$, $ZrO_2$, $ZrCl_4$, $ZrF_4$, $Nb_2O_5$, $NbOCl_3$, $Mo(CO)_6$, $CdCl_2$, $InCl_3$, $SnO_2$, $Sb_2O_3$, CsI, CsCl, CsF, $Ta_2O_5$, $TaCl_5$ or $TaF_5$), or the like.

(3) The electrode bezel pattern 121 and the bezel part 122 may be formed in gold color, by using titanium based nitride (TiN), and the electrode bezel pattern 121 and the bezel part 122 may be formed in red color, by using copper based oxide ($Cu_2O$), iron based oxide ($Fe_2O_3$), ZnTe, tris(bipyridine)ruthenium chloride, $PdCl_2$, CdSe, or the like.

(4) The electrode bezel pattern 121 and the bezel part 122 may be formed in green color, by using chrome based oxide ($Cr_2O_3$), MnO, NiO, $MoCl_5$, or $BiI_3$, and the electrode bezel pattern 121 and the bezel part 122 may be formed in yellow color, by using sodium based oxide ($Na_2O_2$), $K_2O$, CaO, $V_2O_5$, ZnSe, GaN, GaP, Rb2O, $NbCl_5$, CdS, $CdI_2$, $In_2O_3$, $Sb_2O_5$, $Cs_2O$, $WO_3$, $Bi_2O_3$, or the like.

(5) The electrode bezel pattern 121 and the bezel part 122 may be formed in gray color, by using $MgB_2$, $Si_3N_4$, RbOH, $BaO_2$, ZrC, NbO, $MoSi_2$, WC, $Bi_2Te_3$, or the like, and the electrode bezel pattern 121 and the bezel part 122 may be formed in purple color, by using $Ru(acac)_3$.

(6) The electrode bezel pattern 121 and the bezel part 122 may be formed in brown color, by using $Pd(O_2CCH_3)_2$, CdO, InSb, tantalum carbide, or the like, and the electrode bezel pattern 121 and the bezel part 122 may be formed in blue color, by using $WCl_6$.

The electrode bezel pattern 121 and the bezel part 122 may be simultaneously formed by coating a bezel ink through a method of screen printing, roll coating, spin coating, or the like, and then performing exposing and developing processes.

With respect to the electrode bezel pattern 121 having one of the various colors, the electrode pattern 130' may be integrally provided on the lower surface of the electrode bezel pattern 121 having various colors. For example, the electrode bezel pattern 121 and the electrode pattern 130' may be patterned by forming a large electrically conductive metal film formed of a metal material, such as, Ag, Cu, Al, Mo, Au, or the like, or a multilayer structure containing at least one thereof, using a plating process, a physical vapor deposition (PVD) method, and then performing a patterning process.

The insulating layer 140 is a transparent material layer burying the electrode part between the window substrate 110 and the anti-reflection layer 150, and may be formed by using for example optical clear adhesive (OCA), epoxy, aryl based resin, or the like.

The touch panel 100 according to the preferred embodiment of the invention may realize improved visibility and high touch sensitivity by including the electrode bezel pattern 121 between the window substrate 110 and the electrode pattern 130'.

That is, in the touch panel 100 according to the preferred embodiment of the invention, the electrode bezel pattern 121 is used to prevent sparkling due to metallic luster of the electrode pattern 130', and the electrode bezel pattern 121 is integrally formed with the electrode pattern 130' in the same mesh structure of the electrode pattern 130', so that visibility of the electrode pattern 130' can be improved and low resistance can be realized and thus high touch sensitivity can be obtained.

Figure 2:
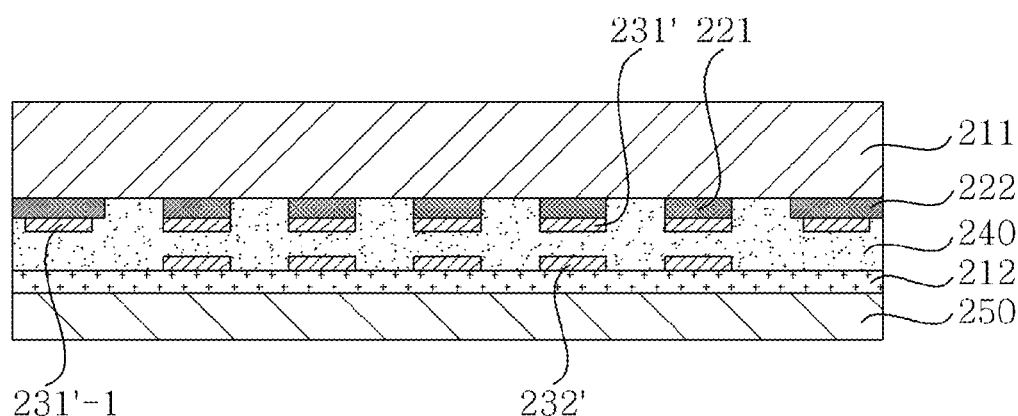
FIG. 2 is a cross-sectional view of a touch panel according to another preferred embodiment of the present invention.

Hereinafter, a touch panel according to another preferred embodiment of the present invention will be described with reference to FIG. 2. FIG. 2 is a cross-sectional view of a touch panel according to another preferred embodiment of the present invention. The touch panel 200 according to another preferred embodiment of the invention shown in FIG. 2 is a double-layer structure mutual capacitive type touch panel, and includes a first electrode pattern 231' in a mesh type, formed in an X-axis direction and a second electrode pattern 232' in a mesh type, formed in a Y-axis direction. The coordinate of a touch point is sensed by measuring capacitance formed between both electrode patterns. Here, descriptions of the same constitutions between the touch panel 200 according to another preferred embodiment of the present invention shown in FIG. 2 and the touch panel 100 according to one preferred embodiment of the present invention shown in FIG. 1 will be omitted.

A touch panel 200 according to another preferred embodiment of the present invention may include: a window substrate 211 divided into an active area and a non-active area surrounding the active area; an electrode part having an electrode bezel pattern 221 formed of a bezel ink on a lower surface of the active area of the window substrate 211 and a first electrode pattern 231' integrally formed on one surface of the electrode bezel pattern 221; a bezel part 222 surrounding the electrode part on a lower surface of the non-active area of the window substrate 211, a first bus line (231-1') being provided on one surface of the bezel part 222; a transparent substrate 212 having a second electrode pattern 232' corresponding to the first electrode pattern 231' of the electrode part; an insulating layer 240 provided between the window substrate 211 and a transparent substrate 212; and an anti-reflection layer 250 provided on a lower surface of the transparent substrate 212.

The electrode part may be formed in a mesh pattern by integrally including the electrode bezel pattern 221 formed of a bezel ink on the lower surface of the active area of the window substrate 211 and the first electrode pattern 231' formed on the lower surface of the electrode bezel pattern 221. Here, the electrode bezel pattern 221 may be formed of the same bezel ink as the bezel part 222 in, for example, an X-axis direction, and thus may have the same color as the bezel part 222 in a mesh pattern.

The second electrode pattern 232' may be formed on the upper surface of the transparent substrate 212 in, for example, a Y-axis direction correspondingly to the first electrode pattern 231', and the anti-reflection layer 250 may be provided on the lower surface of the transparent substrate 212. Here, the transparent substrate 212 may have the second electrode pattern 232', and a second bus line (not shown) formed in the non-active area and connected to the second electrode pattern 232'.

Specifically, the transparent substrate 212 may be formed of polyethyleneterephthalate (PET), polycarbonate (PC), polymethylmethacrylate (PMMA), polyethylenenaphthalate (PEN), polyethersulfone (PES), cyclic olefin copolymer (COC), triacetylcellulose (TAC) film, polyvinyl alcohol (PVA) film, polyimide (PI) film, polystyrene (PS), biaxially oriented polystyrene (BOPS; containing K resin), glass, tempered glass, or the like, but is not particularly limited thereto.

The touch panel 200 according to another preferred embodiment of the present invention is a double-layer structure mutual capacitive type touch panel, in which the electrode bezel pattern 221 is used to prevent sparkling due to metallic luster of the first electrode pattern 231'.

In addition, in the touch panel 200 according to another preferred embodiment of the present invention, the electrode bezel pattern 221 is formed in the same mesh structure as the first electrode pattern 231', so that visibility of the first electrode pattern 231' can be improved and low resistance can be realized and thus high touch sensitivity can be obtained.

Figure 3A:
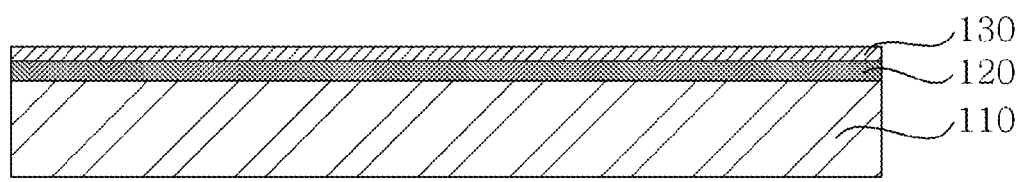
FIGS. 3A to 3C are process cross-sectional views showing a method for manufacturing the touch panel according to one preferred embodiment of the present invention.
Figure 3B:
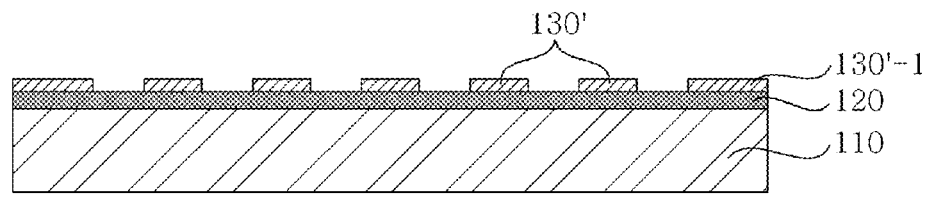
Figure 3C:
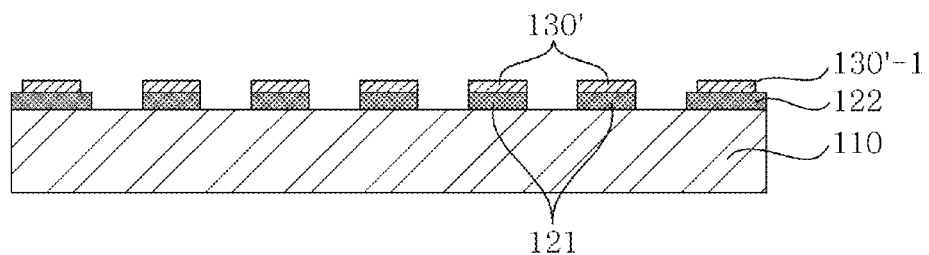

Hereafter, a method for manufacturing the touch panel according to one preferred embodiment of the present invention will be described with reference to FIGS. 3A to 3C. FIGS. 3A to 3C are process cross-sectional views showing a method for manufacturing the touch panel according to one preferred embodiment of the present invention. Here, the method for manufacturing the touch panel according to one preferred embodiment of the present invention with reference to FIGS. 3A to 3C will be described by exemplifying the touch panel 100 according to one preferred embodiment of the present invention shown in FIG. 1.

As shown in FIG. 3A, as for the method for manufacturing the touch panel according to one preferred embodiment of the present invention, a bezel ink layer 120 and a metal layer 130 are sequentially stacked on an upper surface of a window substrate 110 previously prepared.

Specifically, the bezel ink layer 120 is coated on the upper surface of the window substrate 110 by a method such as screen printing, roll coating, spin coating, or the like, the bezel ink being realized in various colors and being used to form an electrode bezel pattern 121 and a bezel part 122.

The bezel ink layer 120 may be formed in black color, white color, gold color, red color, green color, yellow color, gray color, purple color, brown color, blue color, or a combination thereof, by using a bezel ink containing the following materials.

(1) A bezel ink for forming the bezel ink layer 120 in black color may contain a carbon based material (graphene oxide, diamond line carbon (DLC)), chrome based oxide (CrO, $CrO_2$), copper based oxide (CuO), manganese based oxide ($MnO_2$), cobalt based oxide (CoO), sulfide ($CoS_2$, $Co_3S_4$), nickel based oxide ($Ni_2O_3$), HgTe, $YBa_2Cu_3O_7$, $MoS_2$, $RuO_2$, PdO, InP, SnO, TaN, $TaS_2$, or the like.

(2) A bezel ink for forming the bezel ink layer 120 in white color may contain titanium based oxide ($TiO_2$), aluminum based oxide ($Al_2O_3$), magnesium based oxide (MgO), sodium based oxide ($Na_2O$), lithium based oxide ($Li_2O$), beryllium based oxide (BeO), magnesium based sulfide (MgS, $MgF_2$, $MgCo_3$, ZnO, ZnS, $KNO_3$, KCl, KOH, $Ga_2O_3$, RbCl, RbF, $BaTiO_3$, $BaSO_4$, $BaCl_2$, BaO, $Ba(NO_3)_2$, $BaCO_3$, BaOH, $BaB_2O_4$, $SrTiO_3$, $SrCl_2$, SrO, $Y_2O_3$, $YCl_3$, $YF_3$, $ZrO_2$, $ZrCl_4$, $ZrF_4$, $Nb_2O_5$, $NbOCl_3$, $Mo(CO)_6$, $CdCl_2$, $InCl_3$, $SnO_2$, $Sb_2O_3$, CsI, CsCl, CsF, $Ta_2O_5$, $TaCl_5$ or $TaF_5$), or the like.

(3) A bezel ink for forming the bezel ink layer 120 in gold color may contain titanium based nitride (TiN), and a bezel ink for forming the bezel ink layer 120 in red color may contain copper based oxide ($Cu_2O$), iron based oxide ($Fe_2O_3$), ZnTe, tris(bipyridine)ruthenium chloride, $PdCl_2$, CdSe, or the like.

(4) A bezel ink for forming the bezel ink layer 120 in green color may contain chrome based oxide ($Cr_2O_3$), MnO, NiO, $MoCl_5$, or $BiI_3$, and a bezel ink for forming the bezel ink layer 120 in yellow color may contain sodium based oxide ($Na_2O_2$), $K_2O$, CaO, $V_2O_5$, ZnSe, GaN, GaP, Rb2O, $NbCl_5$, CdS, $CdI_2$, $In_2O_3$, $Sb_2O_5$, $Cs_2O$, $WO_3$, $Bi_2O_3$, or the like.

(5) A bezel ink for forming the bezel ink layer 120 in gray color may contain $MgB_2$, $Si_3N_4$, RbOH, $BaO_2$, ZrC, NbO, $MoSi_2$, WC, $Bi_2Te_3$, or the like, and a bezel ink for forming the bezel ink layer 120 in purple color may contain $Ru(acac)_3$.

(6) A bezel ink for forming the bezel ink layer 120 in brown color may contain $Pd(O_2CCH_3)_2$, CdO, InSb, tantalum carbide, or the like, and a bezel ink for forming the bezel ink layer 120 in blue color may contain $WCl_6$.

After the bezel ink layer 120 containing the above material is formed, the metal layer 130 is stacked in a large electrically conductive metal film formed of a metal material, such as, Ag, Cu, Al, Mo, Au, or the like, or multiple layers containing at least one thereof, using a plating process or a physical vapor deposition (PVD) method.

As shown in FIG. 3B, after sequentially stacking the bezel ink layer 120 and the metal layer 130 on the upper surface of the window substrate 110, the metal layer 130 is subjected to a patterning process including exposing and etching to form an electrode pattern 130' and a bus line 130-1' connected to the electrode pattern 130'.

As shown in FIG. 3C, after forming the electrode pattern 130' and the bus line 130-1', the bezel ink layer 120 is subjected to a patterning process including exposing and etching using the electrode pattern 130' as a mask to form an electrode bezel pattern 121 and a bezel part 122.

Here, a photoresist pattern (not shown) is formed on the bus line 130-1', which is then subjected to a pattern process including exposing and etching to form the bezel part 122.

An anti-reflection layer 150 is joined to the thus formed window substrate 110 having the electrode part and the bezel part 122 by using an insulating layer as an intermediate therebetween.

Certainly, the method for manufacturing the touch panel according to one preferred embodiment of the present invention may be applied to the touch panel 100 according to another preferred embodiment of the present invention in the same manner.

Therefore, as for the method for manufacturing the touch panel according to one preferred embodiment of the present invention, the electrode bezel pattern 121 of the electrode part and the bezel part 122 can be simultaneously formed, and thus a touch panel having improved visibility to the electrode pattern 130' can be manufactured by using the thus formed electrode bezel pattern 121.

Hereinafter, another method for manufacturing the touch panel according to one preferred embodiment of the present invention will be described with reference to FIGS. 4A to 4D. FIGS. 4A to 4D are process cross-sectional views showing another method for manufacturing the touch panel according to one preferred embodiment of the present invention. Here, descriptions of the same parts between another method for manufacturing the touch panel according to one preferred embodiment of the present invention and the method for manufacturing the touch panel according to one preferred embodiment of the present invention shown in FIGS. 3A to 3C will be omitted.

Figure 4A:
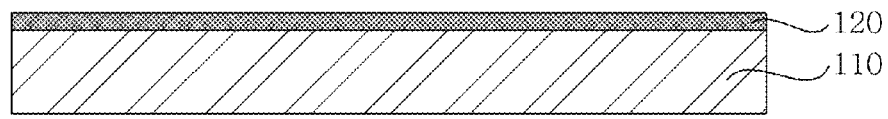
FIGS. 4A to 4D are process cross-sectional views showing another method for manufacturing the touch panel according to one preferred embodiment of the present invention.

As for another method for manufacturing the touch panel according to one preferred embodiment of th present invention, as shown in FIG. 4A, a bezel ink layer 120 is formed on an upper surface of a window substrate 110 previously prepared.

The bezel ink layer 120 may be coated by using a method such as screen printing, roll coating, spin coating, or the like, the bezel ink being realized in various colors, such as, black color, white color, gold color, red color, green color, yellow color, gray color, purple color, brown color, blue color, or a combination thereof, as described above.

Figure 4B:
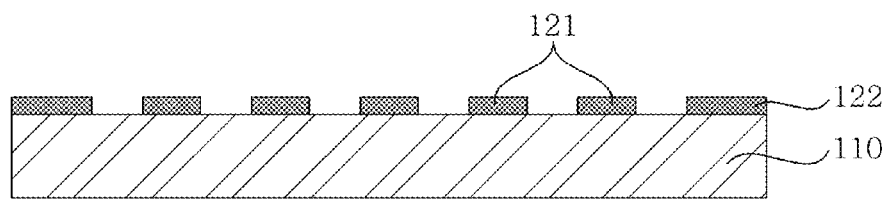

Then, as shown in FIG. 4B, the bezel ink layer 120 is subjected to a patterning process including exposing and etching to form an electrode bezel pattern 121 and a bezel part 122.

Figure 4C:
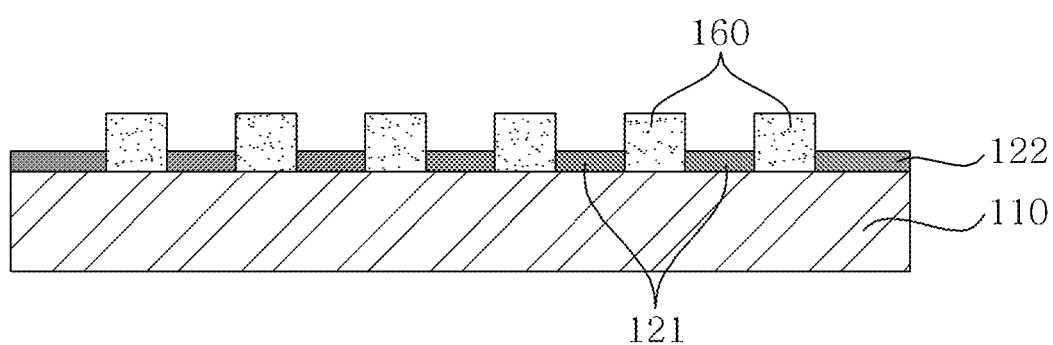
Figure 4D:
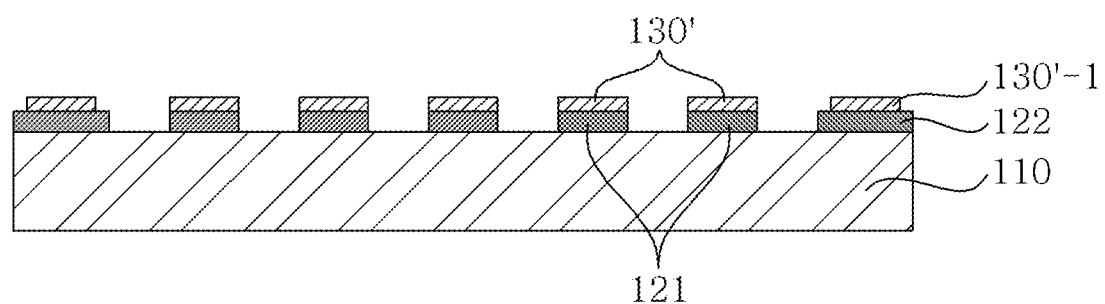

As shown in FIG. 4C, after forming the electrode bezel pattern 121 and the bezel part 122, a photoresist pattern 160 exposing regions in which an electrode pattern 130' and a bus line 130-1' are to be formed is formed.

A plating process or a PVD method, including a large electrically conductive metal material, such as, Ag, Cu, Al, Mo, Au, or the like, or at least one metal material thereof, is performed by using the photosensitive pattern 160.

When the photoresist pattern 160 is filled with the metal material and then a lift-off process is performed to release the photoresist pattern 160, the electrode pattern 130' and the bus line 130-1' are formed. Here, the photoresist pattern 160 may have a release agent in order to facilitate the releasing of the photoresist pattern 160.

An anti-reflection layer 150 is joined to the thus formed window substrate 110 having the electrode part and the bezel part 122 by using an insulating layer as an intermediate therebetween. Certainly, the method for manufacturing the touch panel according to one preferred embodiment of the present invention may be applied to the touch panel 200 according to another preferred embodiment of the present invention in the same manner.

Therefore, as for the method for manufacturing the touch panel according to one preferred embodiment of the present invention, the electrode bezel pattern 121 of the electrode part and the bezel part 122 can be simultaneously formed, and thus a touch panel having improved visibility to the electrode pattern 130' can be manufactured by using the thus formed electrode bezel pattern 121.

As set forth above, the touch panel according to preferred embodiment of the present invention can prevent sparkling due to metallic luster of the electrode pattern by using the electrode bezel pattern formed in the same mesh structure as the electrode pattern.

Further, the method for manufacturing the touch panel according to the preferred embodiment of the present invention can provide a touch panel capable of improving visibility of to the electrode pattern and realizing low resistance and thus obtaining high touch sensitivity.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A touch panel, comprising:
    a window substrate divided into an active area and a non-active area surrounding the active area;
    an electrode part having an electrode bezel pattern formed of a bezel ink in the active area of the window substrate and an electrode pattern integrally formed on one surface of the electrode bezel pattern; and
    a bezel part formed of the bezel ink in the non-active area of the window substrate, to surround the electrode part.

2. The touch panel as set forth in claim 1, further comprising:
    an insulating layer burying the electrode part and the bezel part; and
    an anti-reflection layer joined to the window substrate by using the insulating layer as an intermediate.

3. The touch panel as set forth in claim 1, further comprising:
    a transparent substrate having a second electrode pattern corresponding to the electrode part;
    an insulating layer provided between the window substrate and the transparent substrate; and
    an anti-reflection layer provided on the other surface of the transparent substrate.

4. The touch panel as set forth in claim 1, wherein the electrode part is formed in a mesh pattern.

5. The touch panel as set forth in claim 1, wherein the bezel ink has black color, white color, gold color, red color, green color, yellow color, gray color, purple color, brown color, blue color, or a combination thereof.

* * * * *